United States Patent
Zell

(10) Patent No.: US 9,440,734 B2
(45) Date of Patent: Sep. 13, 2016

(54) SYSTEMS AND METHODS FOR AIRCRAFT BRAKE SENSORS

(71) Applicant: Goodrich Corporation, Charlotte, NC (US)

(72) Inventor: Brian Keith Zell, Dayton, OH (US)

(73) Assignee: GOODRICH CORPORATION, Charlotte, NC (US)

( * ) Notice: Subject to any disclaimer, the term of this patent is extended or adjusted under 35 U.S.C. 154(b) by 84 days.

(21) Appl. No.: 14/446,021

(22) Filed: Jul. 29, 2014

(65) Prior Publication Data
US 2016/0031552 A1  Feb. 4, 2016

(51) Int. Cl.
| | |
|---|---|
| *B64C 25/42* | (2006.01) |
| *G01D 5/22* | (2006.01) |
| *G01R 19/00* | (2006.01) |
| *B60T 7/04* | (2006.01) |
| *B60T 8/17* | (2006.01) |
| *B60T 8/32* | (2006.01) |

(52) U.S. Cl.
CPC ............. *B64C 25/42* (2013.01); *B60T 7/042* (2013.01); *B60T 8/1703* (2013.01); *B60T 8/325* (2013.01); *G01D 5/2291* (2013.01); *G01R 19/0084* (2013.01)

(58) Field of Classification Search
CPC ...... B60T 8/1703; B60T 8/171; B60T 8/172; B60T 7/042; B60T 2220/04
See application file for complete search history.

(56) References Cited

U.S. PATENT DOCUMENTS

| | | | |
|---|---|---|---|
| 5,962,777 A | 10/1999 | Salamat et al. | |
| 8,214,121 B2 * | 7/2012 | Cahill | B60T 8/885 701/70 |
| 8,521,391 B2 * | 8/2013 | Krueger | B60T 7/042 303/138 |
| 2010/0276989 A1 | 11/2010 | Metzger, Jr. | |
| 2014/0139333 A1 * | 5/2014 | Burgdorf | B60Q 1/441 340/479 |
| 2014/0331758 A1 * | 11/2014 | Sim | B60T 7/042 73/132 |

FOREIGN PATENT DOCUMENTS

| | | |
|---|---|---|
| EP | 2567872 | 3/2013 |
| GB | 2458378 | 9/2009 |
| GB | 2469891 | 11/2010 |
| WO | 2008052051 | 5/2008 |

OTHER PUBLICATIONS

Extended European Search Report dated Dec. 10, 2015 in European Application No. 1517851639.

* cited by examiner

*Primary Examiner* — Todd Melton
(74) *Attorney, Agent, or Firm* — Snell & Wilmer L.L.P.

(57) ABSTRACT

An aircraft brake system may include a linear variable differential transformer ("LVDT"). A brake control unit ("BCU") may measure an output voltage from the LVDT. The BCU may include a hardware module, a software module, and an offset module. The hardware module may include a preprogrammed threshold voltage. The output voltage may be measured, and an offset voltage may be determined and stored in the offset module. The software module may measure the sum of the output voltage and the offset voltage. In response to the hardware module and the software module indicating that the threshold voltage has been reached, the BCU may allow braking of the aircraft.

14 Claims, 2 Drawing Sheets

SYSTEMS AND METHODS FOR AIRCRAFT BRAKE SENSORS

FIELD

The present disclosure relates to aircraft brake systems, and more particularly, to aircraft brake sensors.

BACKGROUND

An aircraft brake system may include a brake pedal and a brake pedal sensor. The brake pedal sensor may be a linear variable differential transformer ("LVDT"). The LVDT may output a voltage. The voltage may vary depending on the position of the brake pedal. A brake control unit ("BCU") may measure the voltage. The BCU may prevent braking unless the brake pedal is pressed beyond a pedal idle threshold. The BCU may comprise a hardware idle threshold and a software idle threshold. In response to the voltage indicating a pedal position beyond the hardware idle threshold and the software idle threshold, the BCU may permit a braking force to be applied to the aircraft brakes.

SUMMARY

An aircraft brake system may comprise a brake pedal assembly, a linear differential variable transformer ("LVDT"), and a brake control unit ("BCU"). The LVDT may be coupled to the brake pedal assembly. The BCU may comprise a hardware module configured to measure an output voltage of the LVDT, a software module configured to measure the output voltage of the LVDT, and an offset module configured to offset the output voltage measured by the software module.

A method is disclosed. The method may comprise installing a linear variable differential transformer ("LVDT") in an aircraft. An offset voltage of the LVDT for a software module may be determined. The offset voltage may be stored in an offset module.

The foregoing features and elements may be combined in various combinations without exclusivity, unless expressly indicated otherwise. These features and elements as well as the operation thereof will become more apparent in light of the following description and the accompanying drawings. It should be understood, however, the following description and drawings are intended to be exemplary in nature and non-limiting.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of various embodiments herein makes reference to the accompanying drawings, which show various embodiments by way of illustration. While these various embodiments are described in sufficient detail to enable those skilled in the art to practice the inventions, it should be understood that other embodiments may be realized and that logical, chemical and mechanical changes may be made without departing from the spirit and scope of the inventions. Thus, the detailed description herein is presented for purposes of illustration only and not of limitation. For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

Systems and methods for brake pedal sensors are disclosed. A brake pedal assembly may include a brake pedal and a shaft. A linear variable differential transformer ("LVDT") may be coupled to the brake pedal assembly. The LVDT may output a voltage based on a position of the brake pedal. A hardware threshold voltage and a software threshold voltage may each be met to determine that a braking force is being commanded to an aircraft brake. The software threshold voltage may be calibrated and may be offset for different installations. Thus, the LVDT or brake pedal assembly may be altered, installed with larger tolerances, or moved to a different aircraft, and the software threshold voltage may be calibrated to the new configuration.

Figure 1:
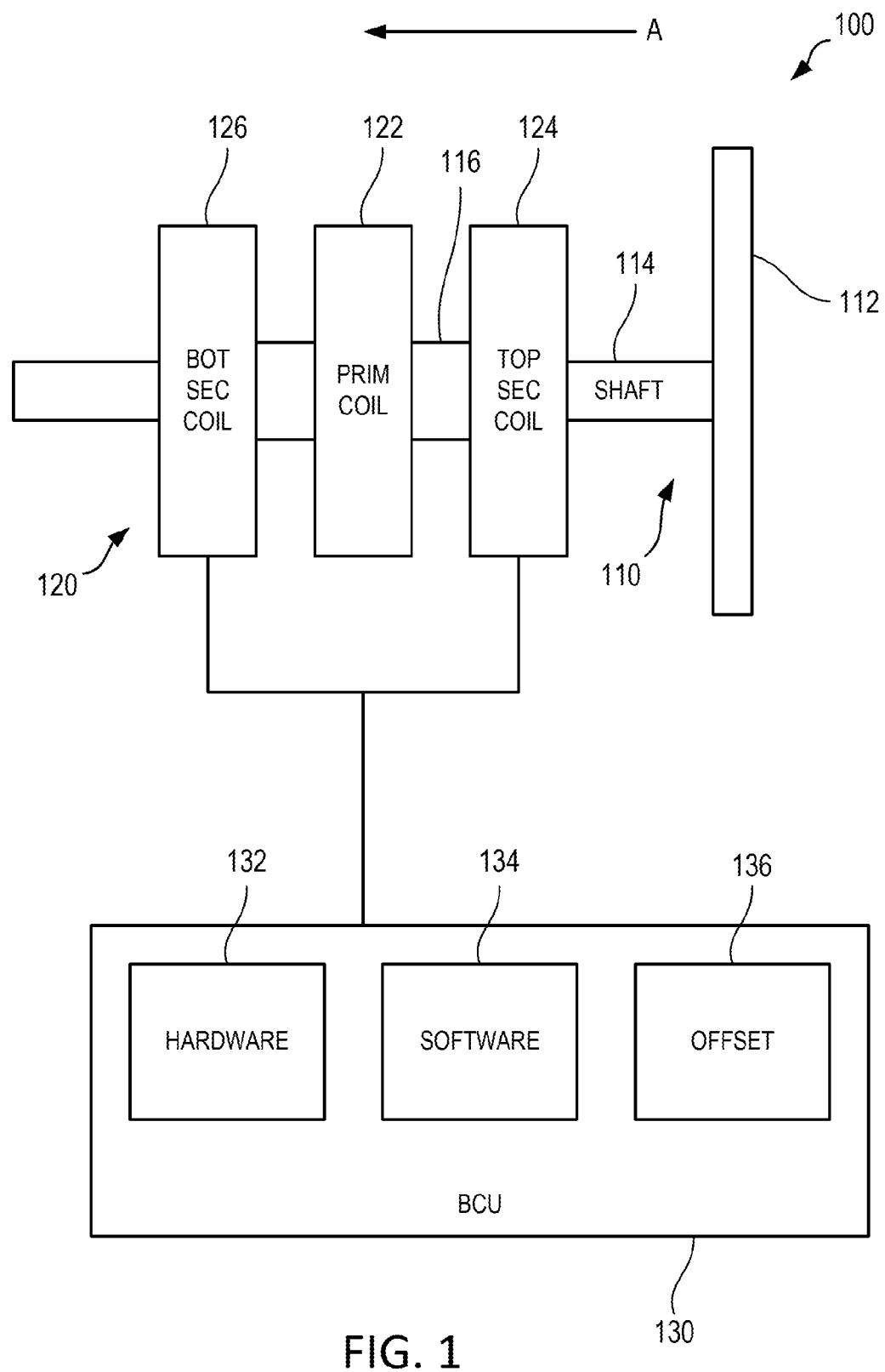
FIG. 1 illustrates a schematic view of an aircraft brake system in accordance with various embodiments.

Referring to FIG. 1, a schematic view of an aircraft brake system 100 is illustrated according to various embodiments. A brake pedal assembly 110 may comprise a pedal 112 and a shaft 114. A pilot may press on the pedal 112 in the direction A in order to apply a braking force to an aircraft. The shaft 114 may comprise a ferromagnetic core 116. The shaft 114 may be located within an LVDT 120. The LVDT 120 may comprise a primary coil 122, a top secondary coil 124, and a bottom secondary coil 126. The primary coil 122, the top secondary coil 124, and the bottom secondary coil 126 may each be located around the shaft 114.

An alternating current may be applied to the primary coil 122. The alternating current may induce a voltage in the top secondary coil 124 and the bottom secondary coil 126. An output voltage may be a differential voltage between the top secondary coil 124 and the bottom secondary coil 126. As the shaft 114 and ferromagnetic core 116 translate within the LVDT 120, the output voltage changes. When the ferromagnetic core 116 is displaced toward the top secondary coil 124, the voltage in the top secondary coil 124 increases as the voltage in the bottom secondary coil 126 decreases. When the ferromagnetic core 116 is displaced toward the bottom secondary coil 126, the voltage in the bottom secondary coil 126 increases as the voltage in the top secondary coil 124 decreases.

An idle pedal position may be the position at which no force is applied to the pedal 112, and thus no braking force should be applied. The idle pedal position may include small changes in position, such that a braking force is not incorrectly applied due to tolerances in the LVDT 120 or brake pedal assembly 110, or an incidental bump of the pedal 112. In various embodiments, the idle pedal position may include from 0% to 10% compression of the brake pedal assembly's 110 full range of motion in the direction A, or in various embodiments, 0-20% of the brake pedal assembly's 110 full range of motion. Once the brake pedal assembly 110 has been displaced beyond the idle pedal position, a threshold voltage output by the LVDT 120 may indicate that braking should occur.

A brake control unit ("BCU") 130 may comprise a hardware module 132 and a software module 134. The hardware module 132 and the software module 134 may measure the output voltage from the LVDT 120. In various embodiments, both the hardware module 132 and the software module 134 may indicate that the threshold voltage has been reached in order to allow braking of the aircraft.

The hardware module 132 may be preprogrammed with a hardware threshold voltage based on the design specifications of the LVDT 120 and brake pedal assembly 110. As used herein, a preprogrammed threshold voltage may refer to a threshold voltage that is programmed prior to measuring an actual output voltage from an installed LVDT and brake pedal assembly. An idle pedal position for a particular LVDT 120 and brake pedal assembly 110 may be from 0% to 15% compression of the pedal 112. The design specifications for the installed LVDT 120 and brake pedal assembly 110 may state that at 0% compression, the output voltage should be 5 V, at 100% compression the output voltage should be 0 V, and at 15% compression, the output voltage should be 4.25 V. Thus, in response to the output voltage decreasing below 4.25 V, the hardware threshold voltage will be reached, and the hardware module 132 may indicate that braking should be allowed.

However, in various embodiments, the actual installation of the LVDT 120 or brake pedal assembly 110 may vary from the design specifications, whether due to installation tolerances, a modified brake pedal assembly, or any other reason. The software module 134 may be calibrated after installation of the LVDT 120 or brake pedal assembly 110. An output voltage may be measured by the software module 134 at known positions, such as at 0% pedal compression and 100% pedal compression. The software threshold voltage may be calculated for the idle pedal position. For example, at 0% pedal compression the output voltage may be measured to be 4.8 V, and at 100% pedal compression the output voltage may be measured to be −0.2 V. The threshold voltage may be calculated for a 15% idle pedal position to be 4.05 V. An offset voltage may be calculated to be the difference between the calculated threshold voltage of 4.05 V, and the expected threshold voltage of 4.25 V.

In various embodiments, the threshold voltage for the software module 134 may be programmed to be the calculated threshold voltage of the software module 134. In response to a pilot pressing the pedal 112, the hardware threshold voltage of 4.25 V may be reached first, and the hardware module 132 may indicate that the hardware threshold voltage has been reached. The software threshold voltage of 4.05 V may subsequently be reached, and the software module 134 may indicate that the software threshold voltage has been reached. In response to both the hardware threshold voltage and the software threshold voltage being reached, the BCU 130 may allow aircraft braking.

In various embodiments, the software threshold voltage may be preprogrammed in the software module 134 similar to the hardware module 132. The software threshold voltage may be measured and calculated as described above. The offset voltage may be stored in a memory (e.g., a non-transitory memory) of the offset module 136. Once calibrated, the output voltage of the LVDT 120 may be modified by the offset module 136 prior to being sent to the software module 134. For example, the software module 134 may be preprogrammed with a software threshold voltage of 4.25 V. However, after measurement, it may be determined that the LVDT 120 has an offset voltage of 0.2 V. The offset voltage may be stored in the offset module 136. In response to the pilot pressing the pedal 112, an output voltage of 4.25 V may be measured by the BCU 130. The hardware threshold voltage of 4.25 V may be reached, and the hardware module 132 may indicate that the hardware threshold voltage has been reached. However, the software module 134 may measure the sum of the output voltage and the offset voltage. The output voltage may be offset by the offset module 136, and the software module 134 may measure a modified output voltage of 4.45 V and indicate that the software threshold voltage has not been reached. Once the pedal 112 is pressed further and the output voltage is 4.05 V, the offset module may offset the voltage by 0.2 V to 4.25 V, and the software module 134 may indicate that the software threshold voltage has been reached. The BCU 130 may determine that both the hardware threshold voltage and the software voltage have been reached, and the BCU 130 may allow aircraft braking.

Figure 2:
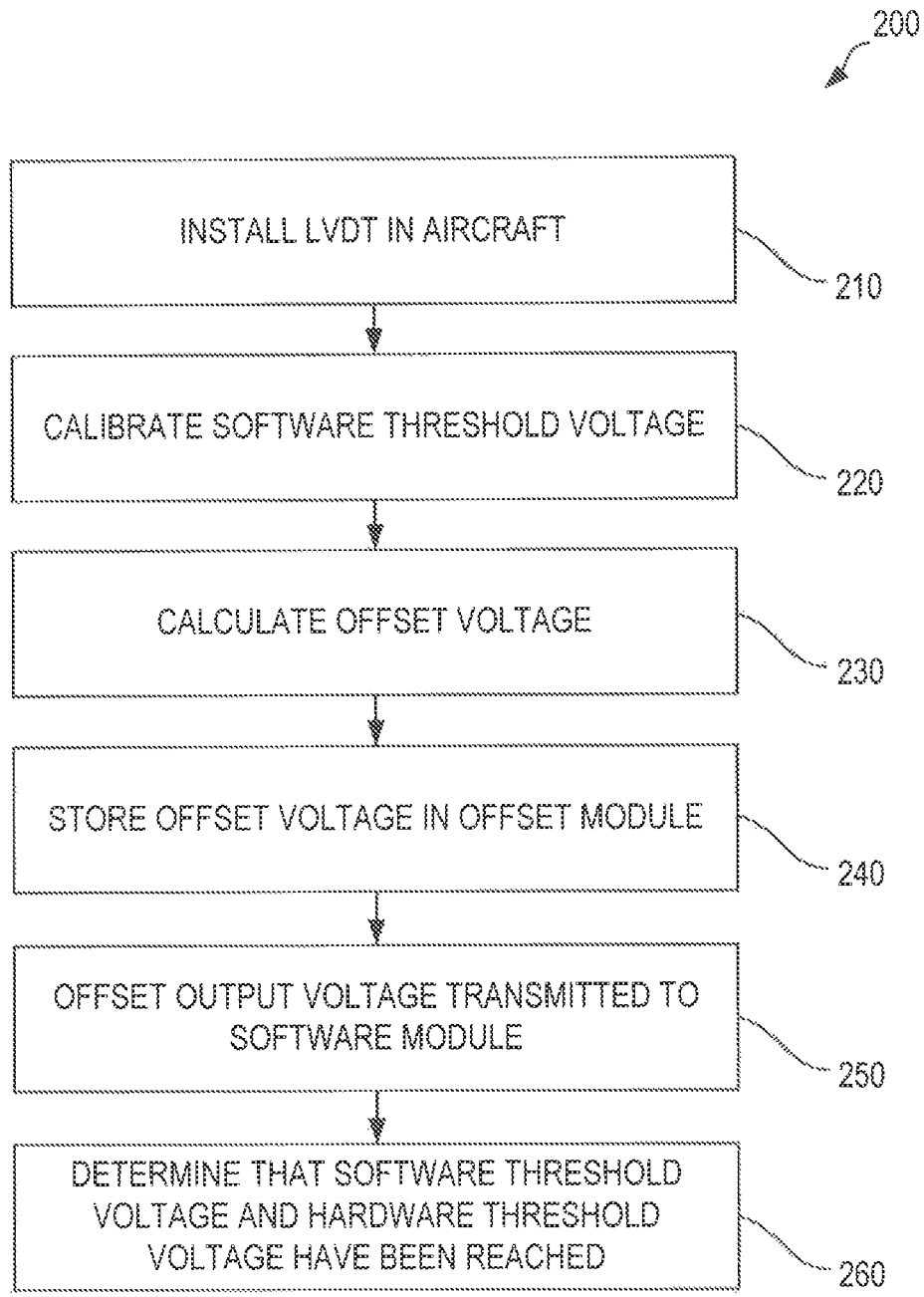
FIG. 2 illustrates a method for braking an aircraft in accordance with various embodiments.

Referring to FIG. 2, a method 200 of braking an aircraft is illustrated according to various embodiment. An LVDT may be installed in an aircraft (step 210). A hardware threshold voltage may be programmed in a hardware module of a BCU. The hardware threshold voltage may be based on an expected voltage for an idle pedal threshold. In various embodiments, a software threshold voltage may be programmed in a software module of the BCU.

The software threshold voltage may be calibrated after installation of the brake pedal assembly (step 220). Calibrating the software threshold voltage may comprise measuring the output voltage of the LVDT at various pedal positions and calculating an output voltage at the idle pedal position. In various embodiments, the calculated software threshold voltage may be programmed in the software module. However, in various embodiments, an offset voltage may be calculated as the difference between the calculated software threshold voltage and the programmed software threshold voltage (step 230). The offset voltage may be stored in an offset module of the BCU (step 240). The output voltage may be measured by the hardware module and the software module. The offset module may offset the output voltage measured by the software module by the offset voltage (step 250). In response to the pedal being pressed beyond an idle pedal position, the BCU may determine that the hardware threshold voltage and the software threshold voltage have been reached (step 260). In response to the hardware threshold voltage and the software threshold voltage being reached, the BCU may permit aircraft braking and/or transmit a signal to an aircraft brake system to apply braking to the aircraft.

In the detailed description herein, references to "one embodiment", "an embodiment", "various embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Benefits, other advantages, and solutions to problems have been described herein with regard to specific embodiments. Furthermore, the connecting lines shown in the various figures contained herein are intended to represent various functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the inventions. The scope of the inventions is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A. B and C may be present in a single embodiment; for example, A and B, A and C, B and C, or A and B and C.

Systems, methods and apparatus are provided herein. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f) unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

I claim:

1. An aircraft brake system comprising:
    a brake pedal assembly comprising a pedal and a shaft;
    a linear differential variable transformer ("LVDT") coupled to the brake pedal assembly, the LVDT comprising:
        a primary coil, a top secondary coil, and a bottom secondary coil, wherein the shaft is located within the primary coil, the top secondary coil, and the bottom secondary coil; and
    a brake control unit ("BCU"), the BCU comprising:
        a hardware module configured to measure an output voltage of the LVDT;
        a software module configured to measure the output voltage of the LVDT; and
        an offset module configured to offset the output voltage measured by the software module, wherein the offset module is configured to be programmed after installation of the LVDT.

2. The aircraft brake system of claim 1, wherein the offset module comprises an offset voltage stored in a non-transitory memory of the offset module.

3. The aircraft brake system of claim 2, wherein the offset voltage comprises a difference between a preprogrammed software threshold voltage and a calculated software threshold voltage.

4. The aircraft brake system of claim 1, wherein the hardware module comprises a preprogrammed hardware threshold voltage.

5. The aircraft brake system of claim 1, wherein the software module comprises a preprogrammed software threshold voltage.

6. A method comprising:
    installing a linear variable differential transformer ("LVDT") in an aircraft;
    determining an offset voltage of the LVDT for a software module; and
    storing the offset voltage in an offset module;
    measuring an output voltage of the LVDT;
    determining that the output voltage is less than a hardware threshold voltage;
    calculating a sum of the offset voltage and the output voltage; and
    permitting, in response to both the output voltage being less than the hardware threshold voltage, and the sum of the offset voltage and the output voltage being less than a software threshold voltage, braking of the aircraft.

7. The method of claim 6, further comprising measuring the output voltage of the LVDT at a first known pedal position, measuring the output voltage of the LVDT at a second known pedal position, and calculating a calculated software threshold voltage for an idle pedal position.

8. The method of claim 7, further comprising calculating the offset voltage from a difference between the calculated software threshold voltage and an expected software threshold voltage.

9. The method of claim 6, further comprising offsetting the output voltage from the LVDT by the offset voltage.

10. The method of claim 6, further comprising determining that the hardware threshold voltage has been reached, and determining that the software threshold voltage has been reached.

11. The method of claim 10, further comprising transmitting an instruction to apply braking to the aircraft in response to the hardware threshold voltage and the software threshold voltage being reached.

12. The method of claim 6, further comprising offsetting, by the offset module, the output voltage by the offset voltage, and
    determining, by the software module, that the software threshold voltage has been reached.

13. The method of claim 6, further comprising braking the aircraft in response to the software threshold voltage and the hardware threshold voltage being reached.

14. The method of claim 6, wherein a hardware module measures the output voltage from the LVDT, wherein the offset module modifies the output voltage, and wherein the software module measures the sum of the output voltage and the offset voltage.

* * * * *